US012658257B2

(12) United States Patent
Tseng et al.

(10) Patent No.:  US 12,658,257 B2
(45) Date of Patent:      Jun. 16, 2026

(54) MEMORY APPARATUS AND METHOD FOR DATA SEARCHING AND COMPARING THEREOF

(71) Applicant: MACRONIX INTERNATIONAL CO., LTD., Hsinchu (TW)

(72) Inventors: Po-Hao Tseng, Taichung City (TW);
Yu-Hsuan Lin, Taichung City (TW);
Feng-Min Lee, Hsinchu City (TW);
Yung-Chun Li, New Taipei City (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 200 days.

(21) Appl. No.: 18/785,113

(22) Filed: Jul. 26, 2024

(65) Prior Publication Data

US 2024/0386958 A1    Nov. 21, 2024

Related U.S. Application Data

(63) Continuation-in-part of application No. 17/583,254, filed on Jan. 25, 2022, now abandoned.

(51) Int. Cl.
*G11C 16/26*        (2006.01)
*G11C 15/04*        (2006.01)
*G11C 16/04*        (2006.01)

(52) U.S. Cl.
CPC ............ *G11C 15/046* (2013.01); *G11C 16/26* (2013.01); *G11C 16/0483* (2013.01)

(58) Field of Classification Search
CPC ... G11C 15/046; G11C 16/26; G11C 16/0483; G11C 2207/063; G11C 7/14; G11C 7/067; Y02D 10/00; G06V 40/172
See application file for complete search history.

(56) References Cited

U.S. PATENT DOCUMENTS

| | | | |
|---|---|---|---|
| 1,141,727 A | 6/1915 | Seaman | |
| 5,345,411 A | 9/1994 | Yoneda | |
| 5,388,065 A | 2/1995 | Yoneda | |
| 8,169,808 B2 | 5/2012 | Roohparvar | |
| 8,634,247 B1 | 1/2014 | Sprouse | |
| 9,875,799 B1 | 1/2018 | De Santis | |
| 10,910,057 B2 | 2/2021 | Alrod et al. | |
| 11,031,080 B1 | 6/2021 | Ogura Iwasaki | |
| 2005/0162923 A1 | 7/2005 | Guterman | |
| 2009/0190404 A1 | 7/2009 | Roohparvar | |
| 2010/0182846 A1 | 7/2010 | Kim | |
| 2014/0347933 A1 | 11/2014 | Lee | |
| 2015/0318047 A1 | 11/2015 | Eldredge | |

(Continued)

*Primary Examiner* — Xiaochun L Chen
(74) *Attorney, Agent, or Firm* — McClure, Qualey & Rodack, LLP

(57) ABSTRACT

The application provides a content addressable memory (CAM) device and a method for searching and comparing data thereof. The CAM device comprises: a plurality of memory strings; and a sensing amplifier circuit coupled to the memory strings; wherein in data searching, a search data is compared with a storage data stored in the memory strings, the memory strings generate a plurality of string currents, the sensing amplifier circuit senses the string currents to generate a plurality of sensing results; based on the sensing results, a match degree between the search data and the storage data is determined as one of the follows: all-matched, partially-matched and all-mismatched.

20 Claims, 10 Drawing Sheets

(56)         References Cited

U.S. PATENT DOCUMENTS

| | | | |
|---|---|---|---|
| 2016/0371335 A1 | 12/2016 | De Santis | |
| 2020/0335146 A1* | 10/2020 | Alrod | G11C 16/26 |
| 2022/0068386 A1 | 3/2022 | Tseng | |
| 2023/0036141 A1 | 2/2023 | Tseng | |
| 2023/0061496 A1 | 3/2023 | Tseng | |

* cited by examiner

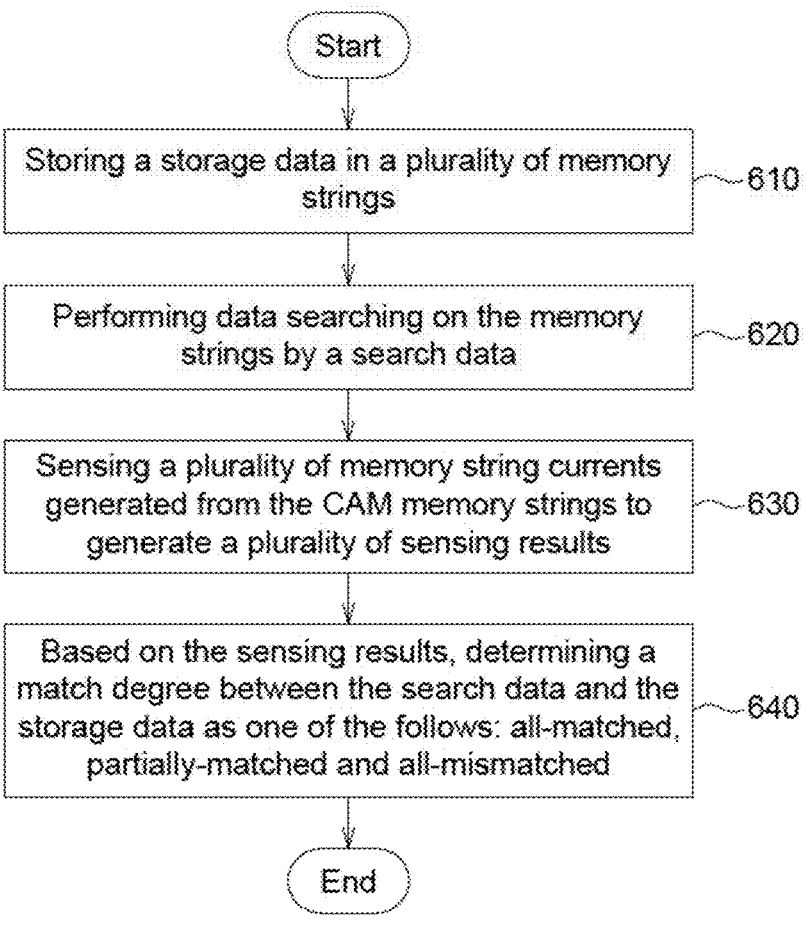

Start

Storing a storage data in a plurality of memory strings ~610

Performing data searching on the memory strings by a search data ~620

Sensing a plurality of memory string currents generated from the CAM memory strings to generate a plurality of sensing results ~630

Based on the sensing results, determining a match degree between the search data and the storage data as one of the follows: all-matched, partially-matched and all-mismatched ~640

End

FIG. 6

MEMORY APPARATUS AND METHOD FOR DATA SEARCHING AND COMPARING THEREOF

This is a continuation-in-part of U.S. application Ser. No. 17/583,254, filed Jan. 25, 2022.

BACKGROUND OF THE INVENTION

Field of the Invention

The invention relates in general to a memory apparatus and a method for searching and comparing data thereof, and more particularly to a memory apparatus and a method for searching and comparing data thereof, which are capable of implementing in-memory approximate searching.

Description of the Related Art

Along with the booming growth in big data and artificial intelligence (AI) hardware accelerator, data search and data comparison have become essential functions. The existing ternary content addressable memory (TCAM) can be configured to implement highly parallel searching. Conventional TCAM is normally formed by static random access memory (SRAM), and therefore has low memory density and requires high access power. Recently, a non-volatile memory array based on TCAM has been provided to save power consumption through dense memory density.

In comparison to the TCAM based on SRAM having 16 transistors (16T), recently a resistive random access memory (RRAM)-based TCAM having 2-transistor and 2-resistor (2T2R) structure has been provided to reduce cell area. Also, standby power consumption can be reduced through the non-volatile RRAM-based TCAM. However, the existing non-volatile TCAM is difficult to distinguish an all-match state and a 1-bit-mismatch state. That is, the existing non-volatile TCAM is not capable of implementing in-memory approximate searching.

Therefore, it has become a prominent task for the industries to provide a CAM device and a method for searching and comparing data thereof, which are capable of implementing in-memory approximate searching.

SUMMARY OF THE INVENTION

According to the first aspect of the present invention, a memory apparatus is provided. The memory apparatus comprises a plurality of memory strings, each of the plurality of memory strings including a plurality of CAM cells and a string resistance. The memory apparatus also comprises a sensing amplifier circuit coupled to the plurality of memory strings. During a data searching operation, a string voltage is applied to the plurality of memory strings and a search data is input for comparing with a storage data stored in the plurality of CAM cells of the plurality of memory strings. On each of the plurality of memory strings, the string voltage and the string resistance corresponding to a number of mismatched bit(s) between the search data and the storage data enables a string current. The string current on each of the plurality of memory strings is sensed by the sensing amplifier circuit to generate a plurality of sensing results including at least one of an all-matched degree, a partially matched degree or an all-mismatched degree determined based the number of mismatched bit(s) between the search data and the storage data.

According to the second aspect of the present invention, a data search and comparing method for a memory apparatus is provided. The method comprises storing a storage data in a plurality of CAM cells of a plurality of memory strings. The method also comprises performing data searching on the plurality of memory strings by a search data. During performing data searching, a string voltage is applied to the plurality of memory strings and the search data is input for comparing with the storage data stored in the plurality of CAM cells of the plurality of memory strings. The method also comprises sensing, by a sensing amplifier circuit, a plurality of string currents generated from the plurality of memory strings corresponding to a plurality of string resistances to generate a plurality of sensing results. On each of the plurality of memory strings, the string voltage and a string resistance of the plurality of string resistances corresponding to a number of mismatched bit(s) between the search data and the storage data enables a string current of the plurality of string currents. The method also comprises based on the sensing results, determining the plurality of sensing results including at least one of an all-matched degree, a partially matched degree or an all-mismatched degree determined based the number of mismatched bit(s) between the search data and the storage data.

According to the third aspect of the present invention, a 3D memory apparatus is provided. The 3D memory apparatus comprises a plurality of computing arrays, configured to store a plurality of databases, each of the plurality of computing arrays comprising a plurality of blocks, each of the plurality of blocks comprising a plurality of memory strings, each of the plurality of memory strings including a plurality of CAM cells. The 3D memory apparatus also comprises a sensing amplifier circuit coupled to the plurality of memory blocks via a plurality of master bit lines. The 3D memory apparatus also comprises a counting circuit coupled to the sensing amplifier circuit. The 3D memory apparatus also comprises a register coupled to the counting circuit. During a data searching operation, a string voltage is applied to the plurality of memory strings of a selected block of the plurality of blocks, and a search data is input for comparing with a storage data stored in the plurality of CAM cells of the plurality of memory strings of the selected block. On each of the plurality of memory strings of the selected block, the string voltage and the string resistance corresponding to a number of mismatched bit(s) between the search data and the storage data enables a string current. The string current on each of the plurality of memory strings is sensed by the sensing amplifier circuit to generate a plurality of sensing results of the selected block, the plurality of sensing results including at least one of an all-matched degree, a partially matched degree or an all-mismatched degree determined based the number of mismatched bit(s) between the search data and the storage data. The counting circuit is configured to count the plurality of sensing results to generate a plurality of matching scores, and the register is configured to store the plurality of matching scores from the counting circuit.

The above and other aspects of the invention will become better understood with regard to the following detailed description of the preferred but non-limiting embodiment(s). The following description is made with reference to the accompanying drawings.

BRIEF DESCRIPTION OF THE DRAWINGS

FIG. 6 shows a flow chart of a method for searching and comparing data for a CAM device according to one embodiment of the application.

DETAILED DESCRIPTION OF THE INVENTION

Technical terms are used in the specification with reference to generally-known terminologies used in the technology field. For any terms described or defined in the specification, the descriptions and definitions in the specification shall prevail. Each embodiment of the present disclosure has one or more technical features. Given that each embodiment is implementable, a person ordinarily skilled in the art can selectively implement or combine some or all of the technical features of any embodiment of the present disclosure.

One embodiment of the application provides a memory apparatus and a method for searching and comparing data thereof. A search data is applied to a plurality of CAM cells via a plurality of word lines. Storage data is stored in the CAM cells. In data searching or data comparison, in a matched state, a gate overdrive voltage is higher than a threshold voltage and thus the transistor provides a high cell current. On the contrary, in a mismatched state, the gate overdrive voltage is lower than the threshold voltage and thus the transistor provides a low cell current. When the search data is all matched with the storage data, a memory string provides a high memory string current; when the search data is partially matched with the storage data, a memory string provides a middle memory string current; and when the search data is all mismatched with the storage data, a memory string provides a low memory string current. That is, the value of the memory string current depends on the match degree (or the mismatch degree) between the search data and the storage data.

First Embodiment

Figures 1, 2:
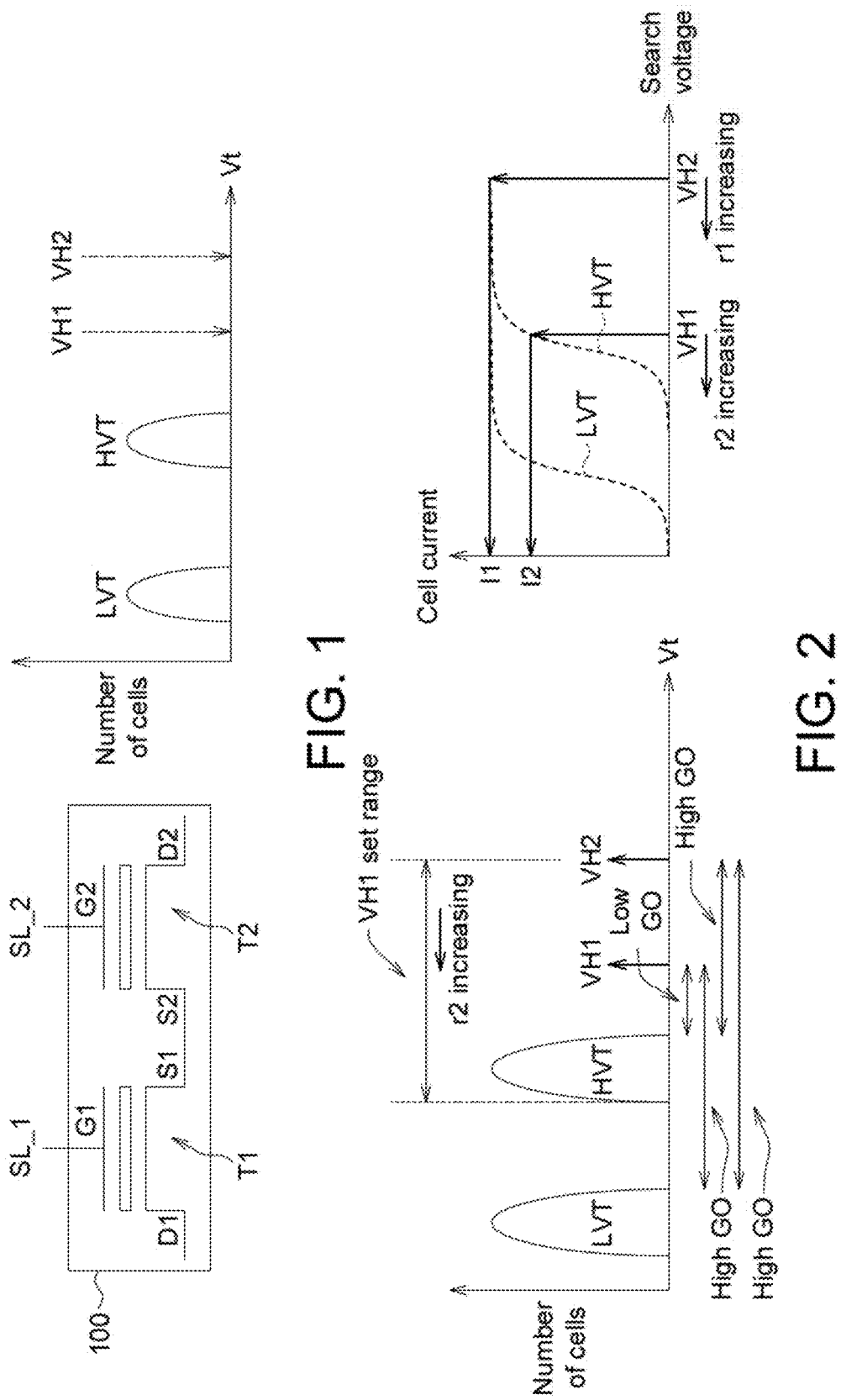
FIG. 1 is a schematic diagram of a CAM cell according to a first embodiment of the present application.
FIG. 2 shows a relationship diagram between the search voltage and the cell current in the first embodiment of the application.

FIG. 1 is a schematic diagram of a CAM cell 100 according to a first embodiment of the present application. As indicated in FIG. 1, the CAM cell 100 according to the first embodiment of the present application may be realized by but is not limited to a single-level CAM capable of storing a single bit.

The CAM cells 100 includes two serial-coupled flash memory cells T1 and T2, wherein the flash memory cells can be realized but is not limited to floating gate memory cells, silicon-oxide-nitride-oxide-silicon (SONOS) memory cells, floating dot memory cells, ferroelectric FET (FeFET) memory cells.

The gate G1 of the flash memory cell T1 is configured to receive a first search voltage SL_1. The gate G2 of the flash memory cell T2 is configured to receive a second search voltage SL_2. The source S1 of the flash memory cell T1 is electrically connected to the source S2 of the flash memory cell T2. The drain D1 of the flash memory cell T1 and the drain D2 of the flash memory cell T2 are electrically connected to other signal lines (not shown).

Storage data of the CAM cell 100 is determined based on a combination of a plurality of threshold voltages of the flash memory cell T1 and the flash memory cell T2.

FIG. 1 further shows a relationship between the threshold voltage (Vt) and the number of the cells. As shown in FIG. 1, in the first embodiment of the application, a high threshold voltage HVT is for example but not limited by, 3-4V while a low threshold voltage LVT is for example but not limited by, lower than 0V. Further, the reference search voltages VH1 and VH2 refers to the possible values of the first search voltage SL_1 and/or the second search voltage SL_2. For example but not limited by, the reference search voltages VH1 and VH2 may be 5V and 8V, respectively, i.e. VH1 is smaller than VH2.

Moreover, in the first embodiment of the present application, the threshold voltage of the flash memory cell T1 (also referred as the first threshold voltage); the threshold voltage of the flash memory cell T2 (also referred as the second threshold voltage), the first search voltage SL_1 and the second search voltage SL_2 may be set as follows. The search data is decoded into the first search voltage SL_1 and the second search voltage SL_2.

| Storage data | 1 | 0 | X (don't care) | Invalid data |
|---|---|---|---|---|
| the first threshold voltage | HVT | LVT | HVT | LVT |
| the second threshold voltage | LVT | HVT | HVT | LVT |

| Search data | 1 | 0 | Wildcard (WC) | Invalid search |
|---|---|---|---|---|
| the first search voltage SL_1 | VH1 | VH2 | VH2 | VH1 |
| the second search voltage SL_2 | VH2 | VH1 | VH2 | VH1 |

In the first embodiment of the present application, when the storage data is a first predetermined storage data (1), the first threshold voltage is the high threshold voltage HVT and the second threshold voltage is the low threshold voltage LVT; when the storage data is a second predetermined storage data (0), the first threshold voltage is the low threshold voltage LVT and the second threshold voltage is the high threshold voltage HVT; when the storage data is a third predetermined storage data (X (don't care)), the first threshold voltage and the second threshold voltage are both the high threshold voltage HVT; and when the storage data is a fourth predetermined storage data (that is, invalid data), the first threshold voltage and the second threshold voltage are both the low threshold voltage LVT. That is, in the first embodiment of the present application, the storage data of the CAM cell 100 is based on a combination of the first threshold voltage of the flash memory cell T1 and the second threshold voltage of the flash memory cell T2.

In the first embodiment of the present application, when the search data is a first predetermined search data (0), the first search voltage SL_1 is the first reference search voltage VH1 and the second search voltage SL_2 is the second reference search voltage VH2, wherein the search data represents data to be searched; when the search data is a second predetermined search data (0), the first search voltage SL_1 is the second reference search voltage VH2 and the second search voltage SL_2 is the first reference search voltage VH1; when the search data is a third predetermined search data (WC), the first search voltage SL_1 and the second search voltage SL_2 are both the second reference search voltage VH2; and when the search data is a fourth predetermined search data (invalid search), the first search voltage SL_1 and the second search voltage SL_2 are both the first reference search voltage VH1, wherein the first reference search voltage VH1 is lower than the second reference search voltage VH2.

FIG. 2 shows a relationship diagram between the search voltage, the cell current and the cell resistance in the first embodiment of the application. It can be understood that, during the searching operation, one end of the cam cell, such as D1 of cam cell 100 of FIG. 1, is applied with a voltage, which generates the cell current corresponding to the cell resistance.

In the first embodiment, the voltage difference between the search voltage (applied to the word line) and the threshold voltage is referred as a gate overdrive voltage (GO). In a matched state, the gate overdrive voltage is higher than a threshold value and the transistor provides a low resistance which enables a high cell current; and in a mismatched state, the gate overdrive voltage is lower than the threshold value and the transistor provides a high resistance which enables a low cell current. Taking FIG. 2 as an example, the reference search voltages VH1 and VH2 may be 5V and 8V, respectively, the high reference threshold voltage HVT is for example but not limited by 3-4V while the low threshold voltage LVT is for example but not limited by, lower than 0V. The gate overdrive voltage between the reference search voltage VH2 (8V) and the high reference threshold voltage HVT (3-4V) is about 4-5V, which is a high gate overdrive voltage; the gate overdrive voltage between the reference search voltage VH2 (8V) and the low threshold voltage LVT (lower than 0V) is about higher than 8V, which is a high gate overdrive voltage; the gate overdrive voltage between the reference search voltage VH1 (5V) and the high reference threshold voltage HVT (3-4V) is about 1-2V, which is a low gate overdrive voltage; the gate overdrive voltage between the reference search voltage VH1 (5V) and the low threshold voltage LVT (lower than 0V) is about higher than 5V, which is a high gate overdrive voltage. In some implementations, VH1 can be set at least higher than the low bond of the HVT (left bond of HVT in FIG. 2) and lower than VH2 (such as the VH1 set range in FIG. 2). For example, if the HVT is 3-4V, and the VH2 is 8V, VH1 can be set higher than 3V and lower than 8V.

In details, when the search voltage is the second reference search voltage VH2, no matter the threshold voltage of the transistor is either the low threshold voltage LVT or the high threshold voltage HVT, the gate overdrive voltage of the transistor is higher than the threshold value and thus the transistor provides a low reference cell resistance (r1, not shown), which enables a high reference cell current (I1). In the case that the search voltage is the first reference search voltage VH1, (1) when the threshold voltage of the transistor is the low threshold voltage LVT, the gate overdrive voltage of the transistor is higher than the threshold value and thus the transistor provides the low reference cell resistance (r1), which enables the high reference cell current (I1); and (2) when the threshold voltage of the transistor is the high threshold voltage HVT, the gate overdrive voltage of the transistor is lower than the threshold value and thus the transistor provides a high reference cell resistance (r2, not shown) which enables a low reference cell current (I2). It can be understood that when the VH1 is set lower (moving left along the curve HVT of FIG. 2), the high reference cell resistance (r2) increases which lowers the low reference cell current (I2), and vice versa. Similarly, when the VH2 is set lower (moving left along the curve LVT of FIG. 2), the low reference cell resistance (r1) increases which lowers the high reference cell current (I1), and vice versa.

In one example, for example but not limited by, when the high threshold voltage HVT is 3-4V, the low threshold voltage LVT is lower than 0V, the reference search voltages VH1 and VH2 may be 5V and 8V, respectively, the high reference cell current (I1) and the low reference cell current (I2) are 100-500 nA and 1-99 nA, respectively, due to the low reference cell resistance (r1) and the high reference cell resistance (r2).

In one embodiment, the match state between the search data and the storage data is as follows (in the perspective of cell current).

| | Search data 1 | Search data 0 | WC | Invalid search |
|---|---|---|---|---|
| Storage data 0 | T1: X<br>T2: O<br>Mismatch (low reference cell current) | T1: O<br>T2: O<br>Match (high reference cell current) | T1: O<br>T2: O<br>Match (high reference cell current) | T1: X<br>T2: O<br>Mismatch (low reference cell current) |
| Storage data 1 | T1: O<br>T2: O<br>Match (high reference cell current) | T1: O<br>T2: X<br>Mismatch (low reference cell current) | T1: O<br>T2: O<br>Match (high reference cell current) | T1: O<br>T2: X<br>Mismatch (low reference cell current) |
| Storage data X | T1: O<br>T2: O<br>Match (high reference cell current) | T1: O<br>T2: O<br>Match (high reference cell current) | T1: O<br>T2: O<br>Match (high reference cell current) | T1: O<br>T2: O<br>Match (high reference cell current) |
| Invalid data | T1: X<br>T2: O<br>Mismatch (low reference cell current) | T1: O<br>T2: X<br>Mismatch (low reference cell current) | T1: O<br>T2: O<br>Match (high reference cell current) | T1: X<br>T2: X<br>Mismatch (low reference cell current) |

X: non-conduct (low gate overdrive voltage)
O: conduct (high gate overdrive voltage)

Thus, when the search data is logic 1 while the storage data is logic 0, the flash memory cell T1 is not conducted while the flash memory cell T2 is conducted, and the cell current of the CAM cell 100 is the low reference cell current (I2), which means the search result is mismatched. When the search data is logic 0 while the storage data is logic 0, the flash memory cell T1 and the flash memory cell T2 are both conducted, and the cell current of the CAM cell 100 is the high reference cell current (I1), which means the search result is matched.

In searching, when the search data is matched with the storage data, the cell current of the CAM cell 100 is the high reference cell current (I1), which means the search result is matched. When the search data is mismatched with the storage data, the cell current of the CAM cell 100 is the low reference cell current (I2), which means the search result is mismatched.

When the search data is wildcard (WC), no matter what value of the storage data is, the cell current of the CAM cell 100 is the high reference cell current (I1), which means the search result is matched. When the search data is invalid search, no matter the storage data is logic 1 or logic 0 or invalid data, the cell current of the CAM cell 100 is the low reference cell current (I2), which means the search result is mismatched.

When the storage data is X (don't care), no matter what value of the search data is, the cell current of the CAM cell 100 is the high reference cell current (I1), which means search result is matched. When the storage data is invalid data, no matter the search data is logic 1, logic 0 or invalid search, the cell current of the CAM cell 100 is the low reference cell current (I2), which means the search result is mismatched.

In other embodiment, the match state between the search data and the storage data is as follows (in the perspective of cell resistance).

| | Search data 1 | Search data 0 | WC | Invalid search |
|---|---|---|---|---|
| Storage data 0 | T1: X<br>T2: O<br>Mismatch<br>(high reference cell resistance (r2)) | T1: O<br>T2: O<br>Match<br>(low reference cell resistance (r1)) | T1: O<br>T2: O<br>Match<br>(low reference cell resistance (r1)) | T1: X<br>T2: O<br>Mismatch<br>(high reference cell resistance (r2)) |
| Storage data 1 | T1: O<br>T2: O<br>Match<br>(low reference cell resistance (r1)) | T1: O<br>T2: X<br>Mismatch<br>(high reference cell resistance (r2)) | T1: O<br>T2: O<br>Match<br>(low reference cell resistance (r1)) | T1: O<br>T2: X<br>Mismatch<br>(high reference cell resistance (r2)) |
| Storage data X | T1: O<br>T2: O<br>Match<br>(low reference cell resistance (r1)) | T1: O<br>T2: O<br>Match<br>(low reference cell resistance (r1)) | T1: O<br>T2: O<br>Match<br>(low reference cell resistance (r1)) | T1: O<br>T2: O<br>Match<br>(low reference cell resistance (r1)) |
| Invalid data | T1: X<br>T2: O<br>Mismatch<br>(high reference cell resistance (r2) | T1: O<br>T2: X<br>Mismatch<br>(high reference cell resistance (r2)) | T1: O<br>T2: O<br>Match<br>(low reference cell resistance (r1)) | T1: X<br>T2: X<br>Mismatch<br>(high reference cell resistance (r2)) |

X: non-conduct (low gate overdrive voltage)
O: conduct (high gate overdrive voltage)

Thus, when the search data is logic 1 while the storage data is logic 0, the flash memory cell T1 is not conducted while the flash memory cell T2 is conducted, and the cell resistance of the CAM cell 100 is the high reference cell resistance (r2), which means the search result is mismatched. When the search data is logic 0 while the storage data is logic 0, the flash memory cell T1 and the flash memory cell T2 are both conducted, and the cell resistance of the CAM cell 100 is the low reference cell resistance (r1), which means the search result is matched.

In searching, when the search data is matched with the storage data, the cell resistance of the CAM cell 100 is the low reference cell resistance (r1), which means the search result is matched. When the search data is mismatched with the storage data, the cell resistance of the CAM cell 100 is the high reference cell resistance (r2), which means the search result is mismatched.

When the search data is wildcard (WC), no matter what value of the storage data is, the cell resistance of the CAM cell 100 is the low reference cell resistance (r1), which means the search result is matched. When the search data is invalid search, no matter the storage data is logic 1 or logic 0 or invalid data, the cell resistance of the CAM cell 100 is the high reference cell resistance (r2), which means the search result is mismatched.

When the storage data is X (don't care), no matter what value of the search data is, the cell resistance of the CAM cell 100 is the low reference cell resistance (r1), which means the search result is matched. When the storage data is invalid data, no matter the search data is logic 1, logic 0 or invalid search, the cell resistance of the CAM cell 100 is the high reference cell resistance (r2), which means the search result is mismatched.

Second Embodiment

Figure 3A:
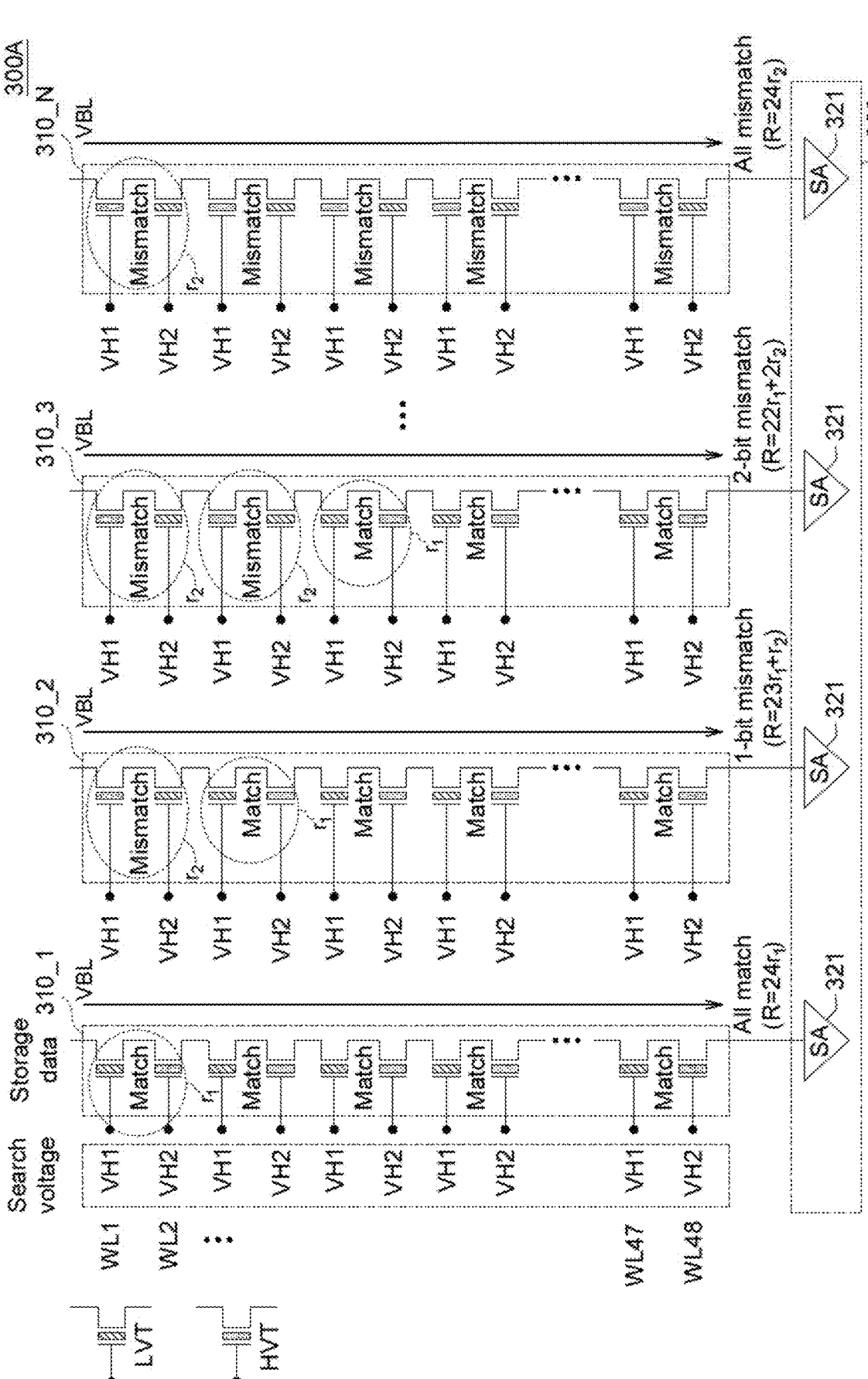
FIG. 3A shows an operation diagram of an example memory apparatus according to a second embodiment of the application.

FIG. 3A shows a circuit diagram of an example memory apparatus 300A according to a second embodiment of the application. As shown in FIG. 3A, the memory apparatus 300A according to the second embodiment of the application includes a plurality of memory strings 310_1-310_N, a sensing amplifier circuit 320 and a plurality of word lines (WL1-WL48 in FIG. 3A, but the application is not limited by this). The sensing amplifier circuit 320 includes a plurality of sensing amplifiers 321 and each of the sensing amplifiers 321 is coupled to one among the memory strings 310_1-310_N.

Each of the memory strings 310_1-310_N includes a plurality of cascaded CAM cells (for example, the CAM cell 100 in FIG. 1).

In-memory approximate searching in the second embodiment of the application is explained.

For simplicity, storage data of the CAM cells of the memory strings 310_1-310_N are as follows. All CAM cells of the memory string 310_1 store logic 1. In the memory string 310_2, one CAM cell stores logic 0 while the other CAM cells store logic 1. In the memory string 310_3, two CAM cells store logic 0 while the other CAM cells store logic 1. All CAM cells of the memory string 310_N store logic 0.

Further, twenty-four search voltage sets are applied to the memory strings 310_1-310_N via the word lines WL1-WL48 for approximate searching. For simplicity, the twenty-four search voltage sets are set as search data 1. It can be understood that, during the searching operation, one end of the memory strings 310_1-310_N, is applied with a string voltage (VBL), which causes a string current (Istring) corresponding to a string resistance (total resistance (R)) on each memory string.

After search, because all CAM cells of the memory string 310_1 store logic 1, all CAM cells of the memory string 310_1 provide the high reference cell currents (I1), which means that the memory string 310_1 provides a string current value corresponding to the total resistance (R) of the memory string 310_1. For the total resistance (R) of the memory string 310_1, after search, because all CAM cells of the memory string 310_1 store logic 1, all CAM cells of the memory string 310_1 provide the low reference cell resistances (r1*24) enabling the memory string having a relatively high current value (Istring). For example, current value of the memory string (Istring) is VBL divided by total resistance (R) of the memory string (24*r1). In one embodiment, the memory string 310_1 is defined as all-match state. That is, the search results of all CAM cells of the memory string 310_1 are all matched.

Similarly, after search, because in the memory string 310_2, one CAM cell stores logic 0 while the other CAM cells store logic 1, the CAM cells of the memory string 310_2 provide twenty-three high reference cell currents (I1) and one low reference cell current (I2), which means that the memory string 310_2 provides a string current value corresponding to the total resistance (R) of the memory string 310_2. For the total resistance (R) of the memory string 310_2, after search, because one CAM cell stores logic 0 while the other CAM cells store logic 1, the CAM cells of the memory string 310_2 provide twenty-three low reference cell resistances (r1*23) and 1 high reference cell resistance (r2) enabling the memory string having a relatively lower current value (Istring). For example, current value of the memory string (Istring) is VBL divided by total resistance (R) of the memory string (23*r1+1*r2). In one embodiment, the memory string 310_2 is defined as 1-bit mismatch state. That is, one CAM cell of the memory string 310_2 has a mismatch search result while the other CAM cells of the memory string 310_2 have match search results.

Similarly, the CAM cells of the memory string 310_3 provide twenty-two high reference cell currents (I1) and two low reference cell currents (I2), which means that the memory string 310_3 provides a string current value corresponding to the total resistance (R) of the memory string 310_3. For the total resistance (R) of the memory string 310_3, the CAM cells of the of the memory string 310_3 provide twenty-two low reference cell resistances (r1*23) and two high reference cell resistances (r2*2) enabling the memory string having a relatively lower current value (Istring) comparing to the 1-bit mismatched state. For example, current value of the memory string (Istring) is VBL divided by total resistance (R) of the memory string (22*r1+2*r2). In one embodiment, the memory string 310_3 is defined as 2-bit mismatch state. That is, two CAM cells of the memory string 310_3 have mismatch search results while the other CAM cells of the memory string 310_3 have match search results.

Similarly, after search, all CAM cells of the memory string 310_N provide twenty-four low reference cell currents (I2), which means that the memory string 310_N provides a string current value corresponding to the total resistance (R) of the memory string 310_N. For the total resistance (R) of the memory string 310_N, the CAM cells of the of the memory string 310_N provide twenty-four high reference cell resistances (r2*24) enabling the memory string having a lowest current value (Istring). For example, current value of the memory string (Istring) is VBL/divided by total resistance (R) of the memory string (24*r2). In one embodiment, the memory string 310_N is defined as all mismatch state. That is, the search results of all CAM cells of the memory string 310_N are all mismatched.

For simplicity, the search results of the memory strings are classified into three types: the all-match state (for example the memory string 310_1), the partial-match state (for example the memory strings 310_2-310_(N−1)) and the all-mismatch state (for example the memory string 310_N), which are respectively corresponding to different current values of the memory streams 310_1-310_N or respectively corresponding to different total resistances (R) of the memory streams 310_1-310_N.

Figure 3B:
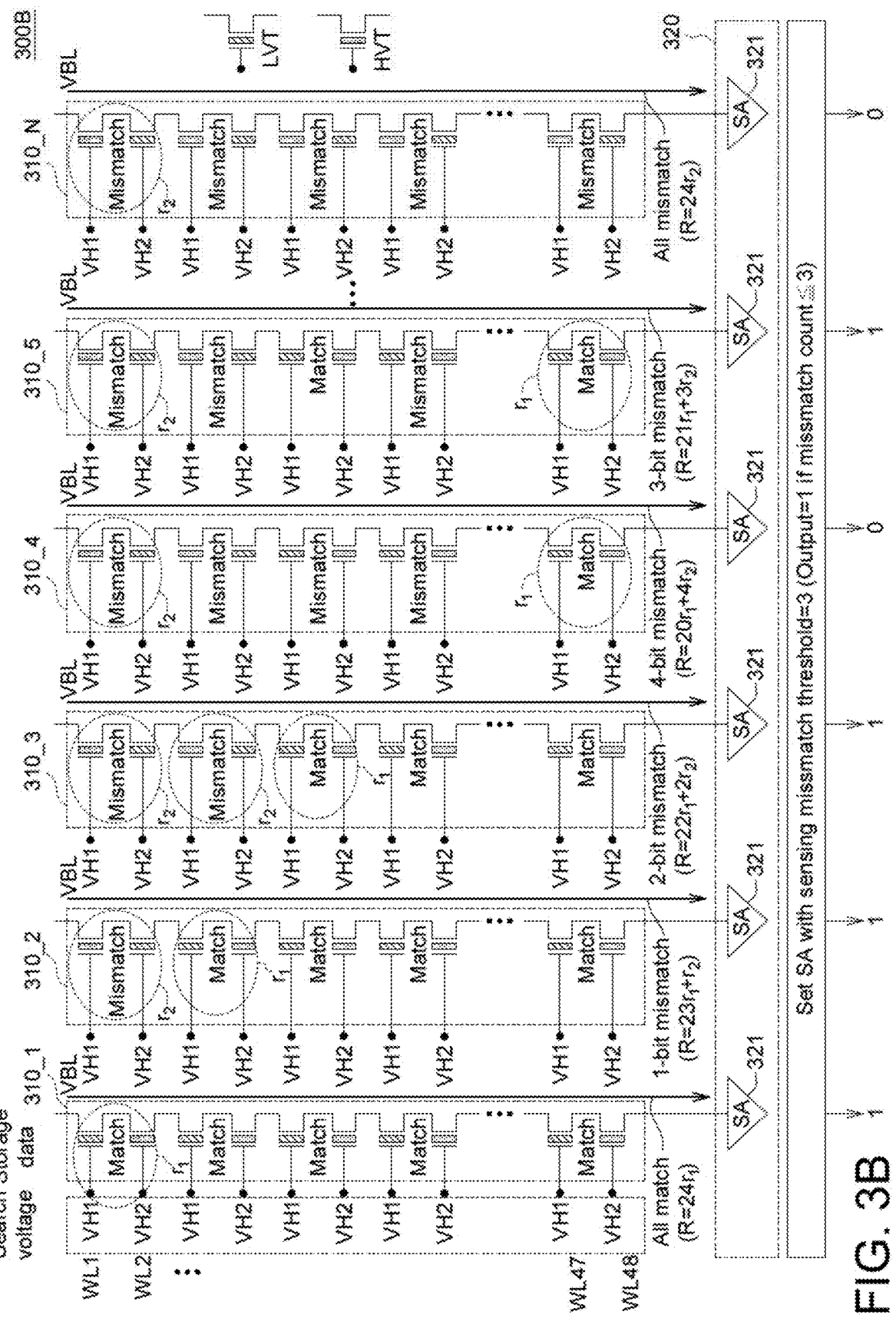
FIG. 3B and FIG. 3C show an operation diagram and a graph of sensing time for an example memory apparatus, respectively, according to another embodiment of the application.
Figure 3C:
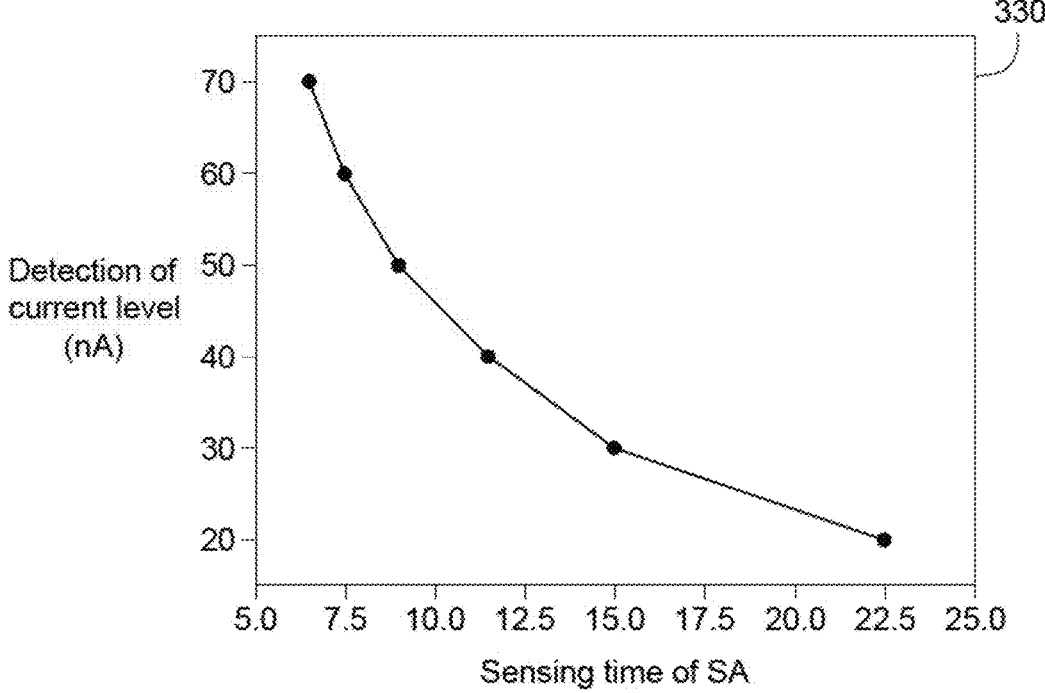

FIG. 3B and FIG. 3C show an operation diagram and a graph of sensing time for an example memory apparatus 300B, respectively, according to another embodiment of the application. As shown by FIG. 3B, in another embodiment of the application, by setting the sensing time of the sensing amplifiers 321 to sense different memory string currents, to differentiate the all-match state, the partial-match state and the all-mismatch state. For example, when the sensing time of the sensing amplifier 321 is tuned to be longer, the sensing amplifier 321 is capable sensing small memory string current (due to the high total resistance of the memory string); and vice versa, as shown by the relation between sensing time and detection of current level of FIG. 3C. More particularly, the sensing time of the sensing amplifiers 321 can be set to output hamming distance (HD) results corresponding to a threshold value. HD can represent the number of bit mismatch. For example, 1 bit mismatch means hamming distance (HD)=1, 15 bit mismatch means hamming distance (HD)=15, 24 bit mismatch means hamming distance (HD)=24 and the likes.

Thus, taken FIG. 3B as an example, if the sensing time of the sensing amplifier 321 is set with sensing mismatch threshold identical to 3, which would sense the memory string having a resistance (R) of not higher than (21*r1+3*r2) (enabling corresponding string current values (Istring)), then the six sensing amplifiers 321 coupled to the memory strings 310_1-310_N enable to sense the memory strings having corresponding string currents due to memory string resistances (R) at least from the memory strings 310_1, 310_2, 310_3 and 310_5 and the other sensing amplifiers 321 do not sense the memory strings having string currents due to memory string resistances (R) at least from the memory strings 310_4 and 310_N (because the memory string having the resistance (R) higher than (21*r1+3*r2) enabling corresponding string current values (Istring), which are disabling to be sensed by set the sensing time of the sensing amplifiers 321). Accordingly, tat least four sensing amplifiers 321 coupled to the memory strings 310_1, 310_2, 310_3 and 310_5 output digital signal 1 (which means the match state between the search data and the storage data) while at least two sensing amplifiers 321 coupled to the memory strings 310_4 and 310_N output digital signal 0, by this example.

That is, when the sensing amplifier 321 senses the memory string current from the memory string (corresponding to the total resistance (R) of memory string), the sensing amplifier 321 outputs digital signal 1; and when the sensing amplifier 321 does not sense the memory string current from the memory string, the sensing amplifier 321 outputs digital signal 0, according to the set sensing time, which the sensing time is set longer, the sensing mismatch threshold is higher. In other words, the sensing time can be set to sense to different HD threshold. For example, by setting a specific sensing time, only the amplifiers coupled to the memory string having HD not higher than 3, output digital signal 1. In some implementations, the number of digital signal 1 and digital signal 0 can be counted to generate a matching score of the memory apparatus 300B, such as by a counting circuit coupled to the sensing amplifiers.

Third Embodiment

Figure 4A:
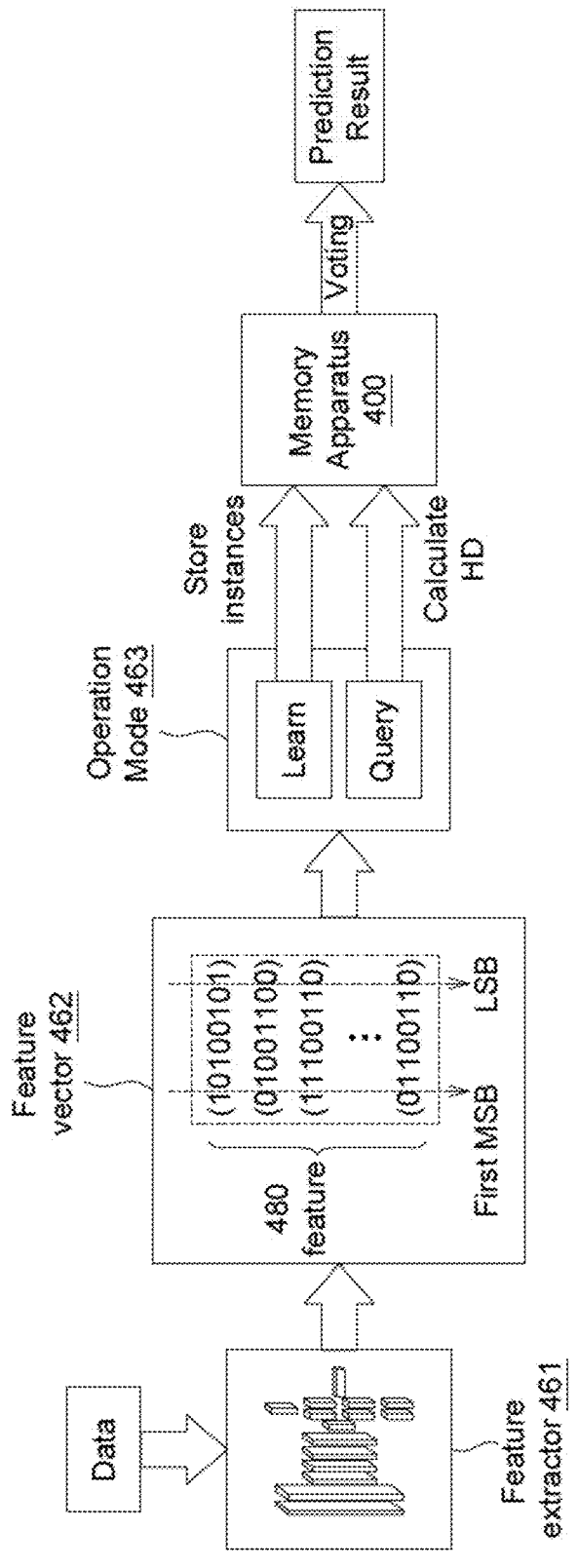
FIG. 4A, FIG. 4B, and FIG. 4C show operation diagrams of an example memory apparatus according to a third embodiment of the application and a decoding result of a face image.
Figure 4B:
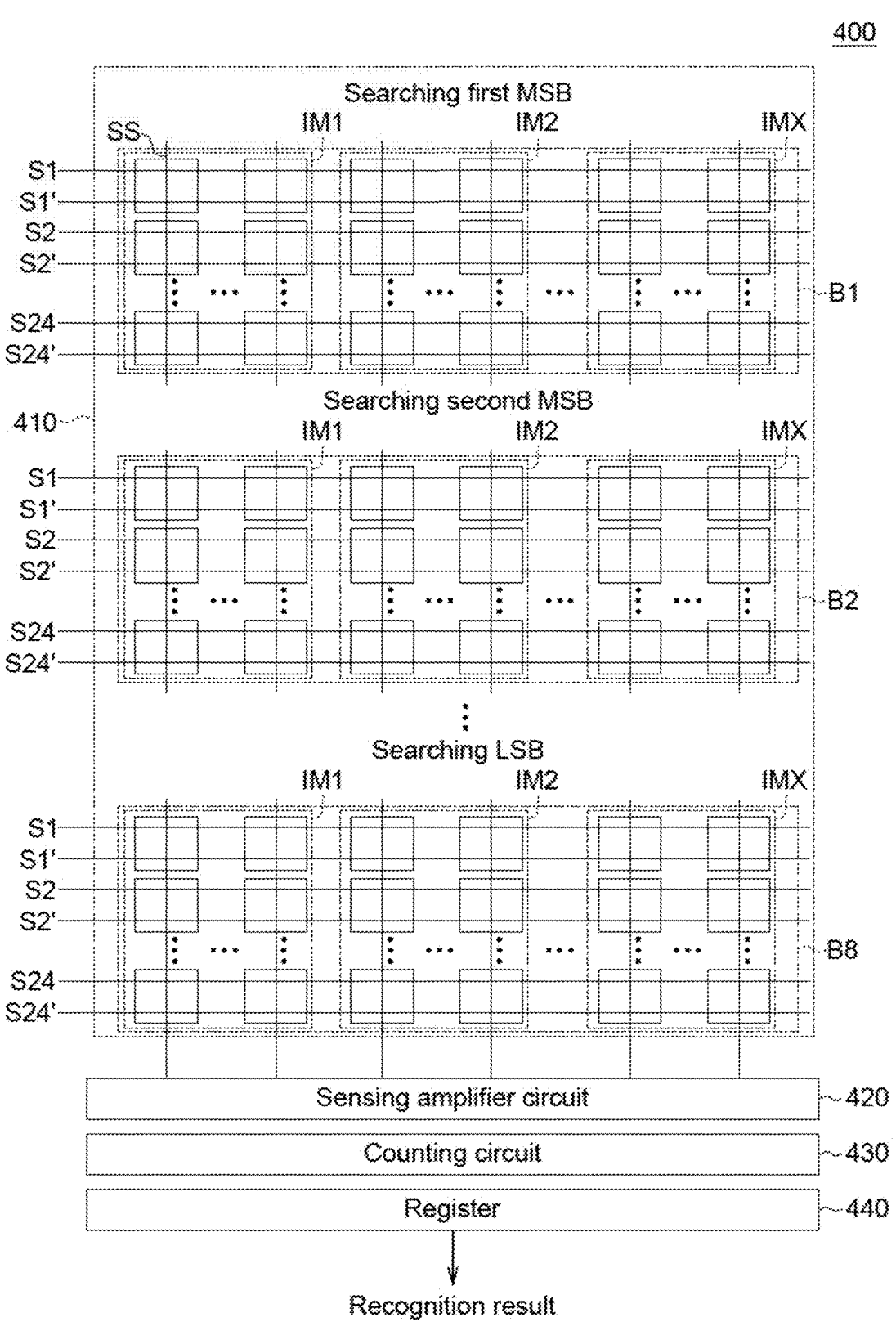
Figure 4C:
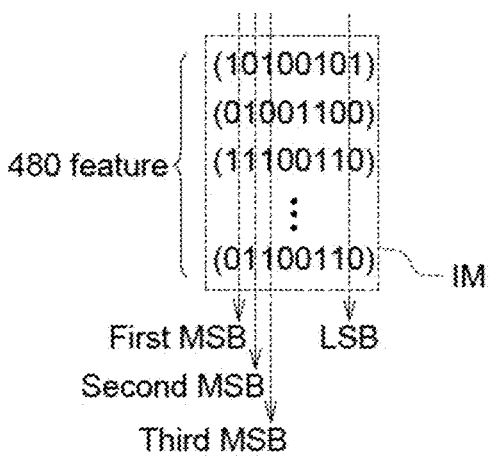

FIG. 4A, FIG. 4B and FIG. 4C show operation diagrams of an example memory apparatus according to a third embodiment of an example application and a decoding result of a face image. The example application of the memory apparatus 400 of the third embodiment in face image recognition, is described to understand how to implement the in-memory approximate search by the memory apparatus 400 of the third embodiment.

As shown by the operation diagram 460 of FIG. 4A, a data (such as face image IM of FIG. 4B) firstly is decoded by a feature extractor 461, into feature vectors 462. For example, the features vector 462 including 480 feature dimensions with 8-bit resolution from a first MSB (most significant bit), a second MSB, . . . , to an LSB (least significant bit), but the application is not limited by this. That is, the face image IM includes 480 first MSBs, 480 second MSBs, . . . , 480 LSBs. That is, the storage data includes 480 first MSBs, 480 second MSBs, . . . , 480 LSBs.

Then, when "learn" of the operation mode 463 mode is selected, the feature vectors 462 are stored in the memory apparatus 400 (such as the memory apparatus 400 of FIG. 4B), as instances. The memory apparatus 400 will be detailed described referring to FIG. 4B as follows.

As shown by FIG. 4B, the memory apparatus 400 includes: a memory array 410, a sensing amplifier circuit 420, a counting circuit 430 and a register 440. The memory array 410 includes a plurality of memory strings SS. The sensing amplifier circuit 420 is coupled to the memory array 410. The sensing amplifier circuit 420 includes a plurality of sensing amplifiers (not shown) respectively coupled to the memory strings. The sensing amplifier circuit 420 senses a plurality of memory string currents from the memory strings SS to generate a plurality of sensing results. The counting circuit 430 is coupled to the sensing amplifier circuit 420 to count the sensing results for generating a plurality of matching scores. In response to the sensing result indicating higher memory string current, the matching score is higher and vice versa. The register 440 is coupled to the counting circuit 430 for storing the matching scores from the counting circuit 430.

In some implementations, the storage data, as instances in memory array 410, includes 480 first MSBs, 480 second MSBs, . . . , 480 LSBs (similarly shown by FIG. 4C, and more particularly, the feature vectors 462 corresponding to a plurality of reference face images IM1-IMX (X being a positive integer of FIG. 4B), are stored in the memory array 410 of the memory apparatus 400, as shown by FIG. 4B. For example, the respective first MSBs of the 480 feature dimensions of the reference face images IM1-IMX are stored in the block B1 of the memory array 410, the respective second MSBs of 480 feature dimensions of the reference face images IM1-IMX are stored in the block B2 of the memory array 410 . . . , and the respective LSBs of 480 feature dimensions of the reference face images IM1-IMX are stored in the block B8 of the memory array 410, as shown by FIG. 4B.

Referring back to FIG. 4A, in other case, when "query" of the operation mode 463 mode is selected, the input data (face images for searching, such as face image IM) is decoded into 480 feature vectors by the feature extractor, then the feature vectors are decoded into a plurality of search voltages S1, S1', S2, S2', . . . , S24 and S24' to perform approximate search on the reference face images IM1-IMX (stored instances). The sensing amplifier circuit 420 senses a plurality of memory string currents (corresponding to total resistance (R) of memory strings as discussed above) from the memory strings SS included by the memory apparatus 400 to generate multiple sensing results, for example, generate the hamming distance (HD) (as discussed referring to FIGS. 3B and 3C) between the store instances (as stored data) and input data (other face images for searching) such as by the sensing amplifier circuit 420, according to the preset HD threshold by setting the sense time of sensing amplifiers of the sensing amplifier circuit 420 (as discussed referring to FIGS. 3B and 3C).

In some implementations, respective matching scores of the reference face images IM1-IMX are counted by the counting circuit 430 and stored in the register 440. Based on the matching scores, a target reference face image, which is corresponding to a highest matching score, among the reference face images IM1-IMX is determined as the same or most similar to the face image under search.

In other implementations, the register 440 is configured to firstly store the multiple sensing results (such as results output from the amplifiers coupled to the memory string having HD not higher than preset HD threshold as digital signal 1, and output from other amplifiers coupled to the memory string having HD higher than preset HD threshold as digital signal 0) from the sensing amplifier circuit 420. In this case, the counting circuit is then configured to count the multiple sensing results stored in the register 440, which, based on numbers of digital signal 1 (output from sensing the memory string having HD not higher than preset HD threshold) in the multiple sensing results, an input data (face images for searching) with the highest match (max number of digital signal 1 in the multiple sensing), among the input data (face images IM1-IMX) is determined as the same or most similar to the stored data (instances for face image) under the search.

Fourth Embodiment

Figure 5:
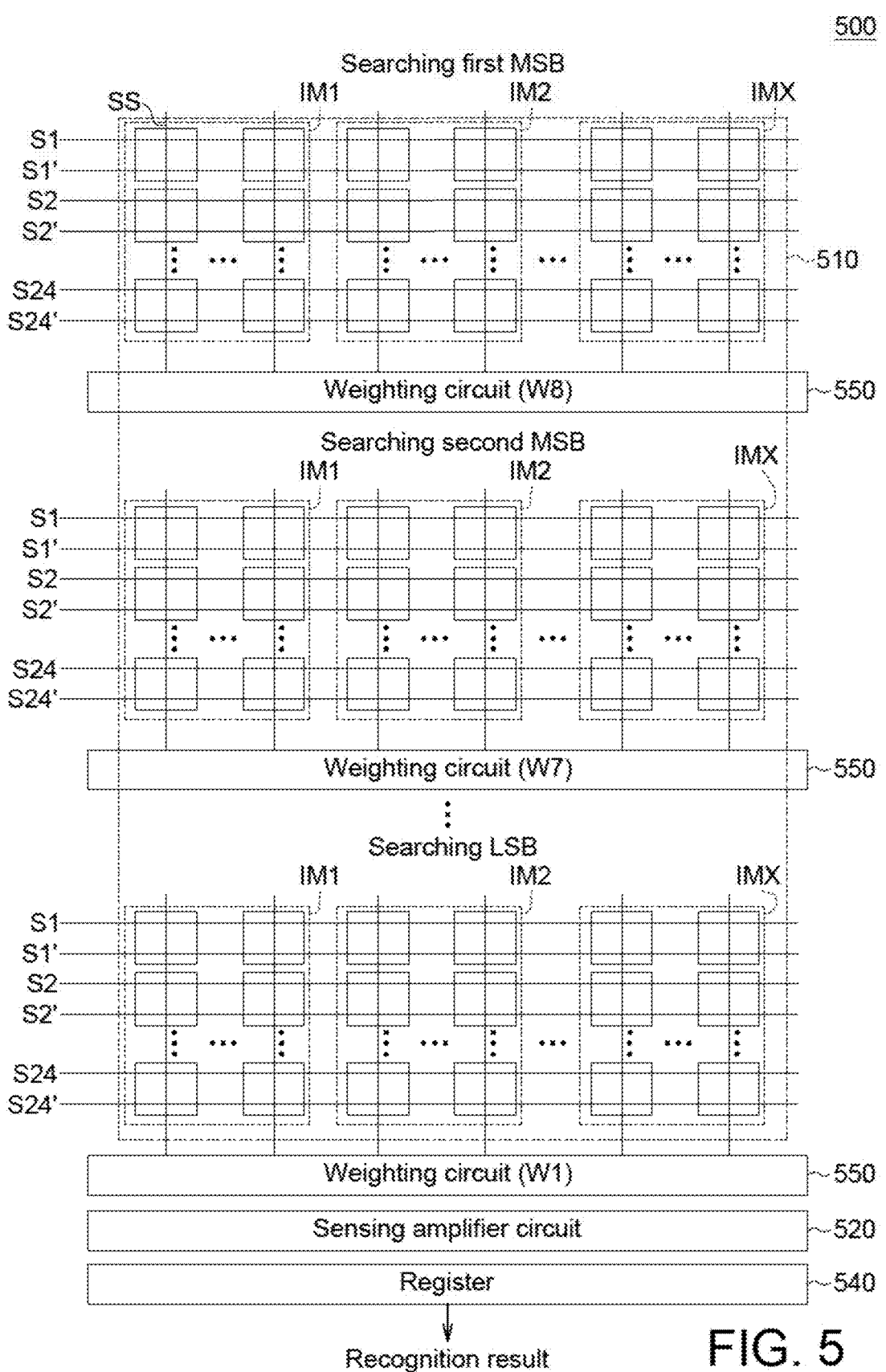
FIG. 5 sows an operation diagram according to a 3D NAND IMS system according to a fourth embodiment of the application.

FIG. 5 sows a circuit diagram according to a CAM device according to a fourth embodiment of the application. As shown in FIG. 5, the CAM device according to the fourth embodiment of the application includes a memory array 510, a sensing amplifier circuit 520, a register 540 and a plurality of weighting circuits 550.

The weighting circuits 550 are coupled to the memory strings of the memory array 510. The weighting circuits 550 assigns different weights to the memory string currents generated from the memory strings.

In face image recognition, MSB of the features dominate image characteristics. Thus, in the fourth embodiment of the application, the weighting circuits 550 are introduced to increase search accuracy. The memory string current generated by searching the first MSBs is assigned by a highest weight W8; the memory string current generated by searching the second MSBs is assigned by a second highest weight W7; . . . ; and the memory string current generated by searching the LSBs is assigned by a lowest weight W1, wherein W8>W7> . . . >W1.

In face recognition, the face image under search is decoded into the search voltages S1, S1', S2, S2', . . . , S24, S24' to perform approximate search on the reference face images IM1-IMX.

The weighted memory string currents generated by searching the reference face images IM1-IMX are summed and stored in the register 540. Based on the summed memory string currents, a target reference face image, which is corresponding to a highest summed string current, among the reference face images IM1-IMX is determined as the same or most similar to the face image under search.

FIG. 6 shows a flow chart of a method for searching and comparing data for a CAM device according to one embodiment of the application. The data search and comparing method for the CAM device comprises: storing a storage data in a plurality of memory strings (610); performing data searching on the memory strings by a search data (620);

sensing a plurality of string currents generated from the memory strings to generate a plurality of sensing results (630); and based on the sensing results, determining a match degree between the search data and the storage data as one of the follows: all-matched, partially-matched and all-mis-matched (640).

Figure 7:
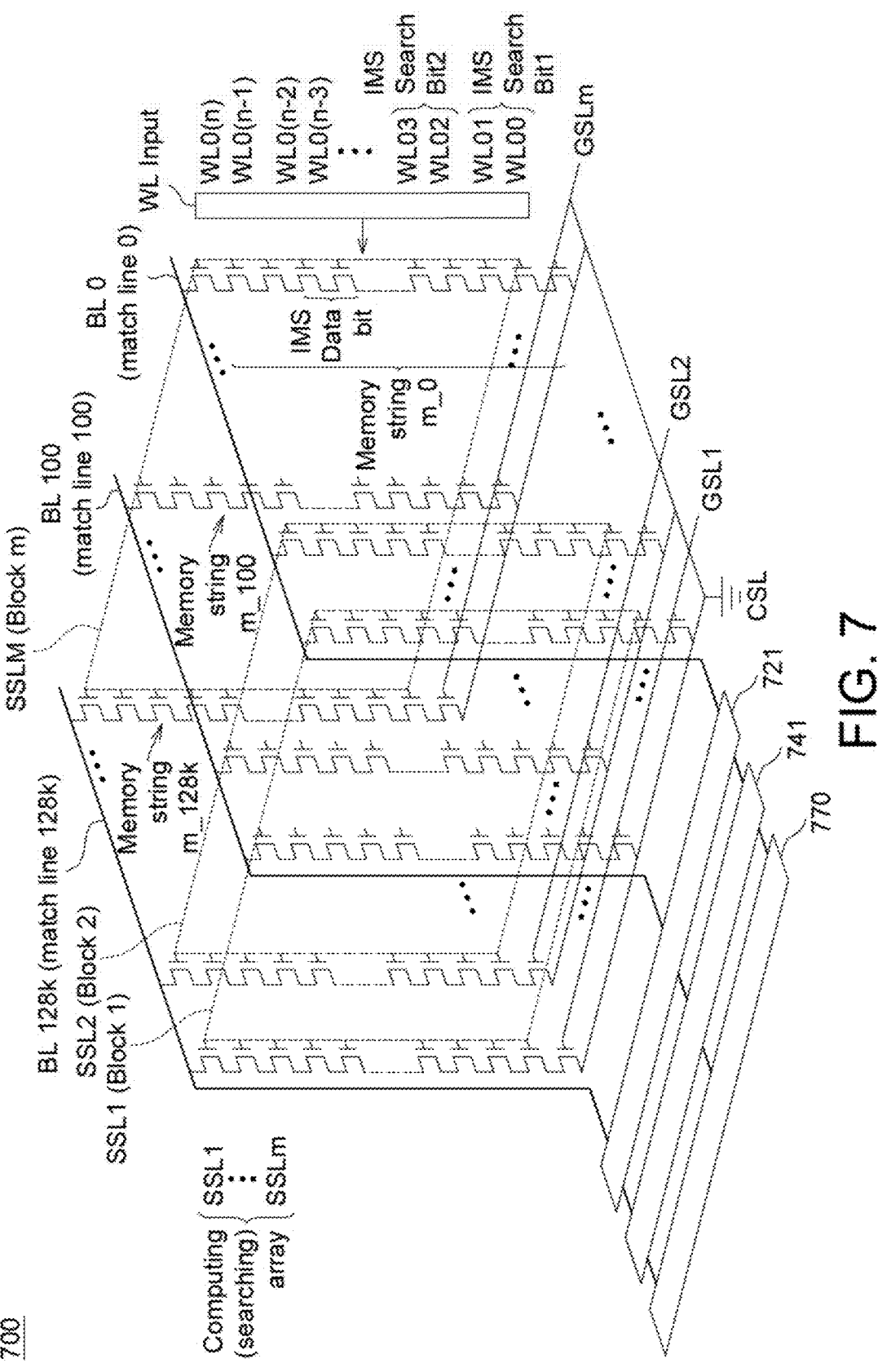
FIG. 7 shows a diagram of a structure of an example 3D memory apparatus according to one embodiment of the application.

FIG. 7 shows a diagram of a structure of an example 3D memory apparatus 700 according to one embodiment of the application. The 3D memory apparatus 700 comprises computing (searching) array including blocks 1-*m* which can be selected by the select source line (SSL) 1-*m*. In some implementations, the 3D memory apparatus 700 comprises multiple computing arrays (not shown), and each computing arrays can store different databases. In some implementations, the blocks of the 3D memory apparatus 700 can be implemented as blocks B1-B8 of the memory apparatus 400 of FIG. 4B. Similarly, each block comprises multiple memory strings, such as the block m including memory strings m_(0-128*k*). It can be understood that, when a block is selected, one end of each memory string of the selected block is applied with a voltage (VBL), for example, through BL0-BL128*k* by a driving circuit (not shown) respectively applying VBL(s) which causes a string current corresponding to a string resistance (total resistance (R)) on each memory string. Also, each memory string comprises multiple cam cells (such as cam cell 100 of FIG. 1) configured to store IMS data bit (such as 1, 0, X (don't care) or invalid data included by reference face images referring to FIG. 4A to FIG. 4C). Each data bit is encoded and stored as the Vt levels of two serial cam cells as discussed above. During the searching operation (such as operations referring to FIGS. 3A to 5), the IMS search bits are encoded into bias levels and be input on word lines of selected block, such as WL00-WL0*n* of the block m. Then, the HD between the search word (IMS search bits) and each data word (IMS data bit) is represented by the string current corresponding to the resistance (R) of each memory string, which determined by the page buffer and sensing amplifier circuit 721 (similar to the sensing amplifier circuit 420 of FIG. 4B) coupled to the memory blocks through the bit line (BL or match line) 0-128 k. The page buffer and sensing amplifier circuit 721 also can temporarily store sensing result of each selected block, then sequentially output the sensing result of each selected block. The sensing result of the page buffer and sensing amplifier 721 then outputs to the cache register and priority encoder circuit 741 for storing and encoding the sensing result of each block. The counting circuit 770 (similar to the counting circuit 430 of FIG. 4B) coupled to the cache register and priority encoder circuit 741, accesses the stored sensing results in the cache register and priority encoder circuit 741 for counting the sensing results of multiple blocks, for example, based on preset HD threshold to indicate the matching level between the search word and each data word in multiple blocks of the computing array, and outputs the recognition result or the prediction result there between. Thus, the 128 k BLs in the selected block of the computing array can be compared in just one read cycle (ultra-high data processing rate). In above embodiments of the present application, the CAM device can be also realized as a two-dimensional (2D) NAND flash memory architecture or a three-dimensional (3D) NAND flash memory architecture, and is still within the spirit of the present application.

In above embodiments of the present application, in performing in-memory approximate search, by assigning different to the memory string currents by searching the MSB and the LSB, the match speed and the match accuracy are improved.

In one embodiment of the application, in performing in-memory approximate search, data search and data comparison are completed during one read cycle. Accompanied by high storage density of the CAM device, the in-memory approximate search may be applicable in different field, for example but not limited by, Big-data searching, AI (artificial intelligence) hardware accelerator/classifier, Approximate Computing, Associative memory, Solid-state drive (SSD) data management, deoxyribonucleic acid (DNA) matching, Data filter and so on.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory apparatus, comprising:
a plurality of memory strings, each of the plurality of memory strings including a plurality of CAM cells and a string resistance; and
a sensing amplifier circuit coupled to the plurality of memory strings;
wherein during a data searching operation, a string voltage is applied to the plurality of memory strings and a search data is input for comparing with a storage data stored in the plurality of CAM cells of the plurality of memory strings,
wherein, on each of the plurality of memory strings, the string voltage and the string resistance corresponding to a number of mismatched bit(s) between the search data and the storage data enables a string current,
wherein the string current on each of the plurality of memory strings is sensed by the sensing amplifier circuit to generate a plurality of sensing results including at least one of an all-matched degree, a partially matched degree or an all-mismatched degree determined based the number of mismatched bit(s) between the search data and the storage data.

2. The memory apparatus according to claim 1,
wherein, on each of the plurality of memory strings,
when the search data is all-matched with the storage data, the string resistance is a first string resistance enabling the string current being a first string current which is sensed by the sensing amplifier circuit, and indicates the all-matched degree in the plurality of sensing results, which the number of mismatched bit(s) between the search data and the storage data is zero;
when the search data is partially-matched with the storage data, the string resistance is a second string resistance enabling the string current being a second string current which is sensed by the sensing amplifier circuit, and indicates the partially-matched degree in the plurality of sensing results, which the number of mismatched bit(s) between the search data and the storage data is in the range of one to zero; and
when the search data is all-mismatched with the storage data, the string resistance is a third string resistance enabling the string current being a third string current which is sensed by the sensing amplifier circuit, and indicates the partially-matched degree in the plurality of sensing results,
wherein the first string current is higher than the second string current, and the second string current is higher than the third string current, wherein the third memory resistance is higher than the second string resistance, and the second string resistance is higher than the first string resistance.

3. The memory apparatus according to claim 1, wherein each of the plurality of CAM cells includes a first memory cell and a second memory cell coupled in series along a channel current path;
when a first predetermined storage data is stored in the CAM cell, a first threshold voltage of the first memory cell is a first reference threshold voltage and a second threshold voltage of the second memory cell is a second reference threshold voltage;
when a second predetermined storage data is stored in the CAM cell, the first threshold voltage of the first memory cell is the second reference threshold voltage and the second threshold voltage of the second memory cell is the first reference threshold voltage;
when a third predetermined storage data is stored in the CAM cell, the first threshold voltage of the first memory cell and the second threshold voltage of the second memory cell are both the first reference threshold voltage; and
when a fourth predetermined storage data is stored in the CAM cell, the first threshold voltage of the first memory cell and the second threshold voltage of the second memory cell are both the second reference threshold voltage.

4. The memory apparatus according to claim 3, wherein
when the search data is a first predetermined search data, a first search voltage applied to the first memory cell is a first reference search voltage and a second search voltage applied to the second memory cell is a second reference search voltage;
when the search data is a second predetermined search data, the first search voltage applied to the first memory cell is the second reference search voltage and the second search voltage applied to the second memory cell is the first reference search voltage;
when the search data is a third predetermined search data, the first search voltage applied to the first memory cell and the second search voltage applied to the second memory cell are both the second reference search voltage; and
when the search data is a fourth predetermined search data, the first search voltage applied to the first memory cell and the second search voltage applied to the second memory cell are both the first reference search voltage,
wherein the first reference search voltage is lower than the second reference search voltage.

5. The memory apparatus according to claim 1, wherein the sensing amplifier circuit includes a sensing time configured to be set to output hamming distance (HD) results corresponding to the all-match state, the partial-match state or the all-mismatch state of the plurality of sensing results,
wherein the sensing amplifier circuit includes a plurality of sensing amplifiers one-to-one coupled to the plurality of memory strings,
wherein when the string current sensed by a sensing amplifier of the plurality of sensing amplifiers, corresponding to the string resistance of a memory string of the plurality of memory strings, is determined as the martial-match state or the all-match state and that the number of mismatched bit(s) lower than a HD threshold value, the sensing amplifier outputs a first logic digital signal; and
when the string current sensed by the sensing amplifier, corresponding to the string resistance of a memory string of the plurality of memory strings, is determined as the martial-match state or the all-mismatched state and that the number of mismatched bit(s) higher than a HD threshold value, the sensing amplifier outputs a second logic digital signal,
wherein a counting circuit coupled to the sensing amplifier circuit is configured to count a number of the first logic digital signal and a number of the second digital signal from the sensing amplifier circuit to generate a plurality of matching scores.

6. The memory apparatus according to claim 2, further including:
a counting circuit coupled to the sensing amplifier circuit, for counting the sensing results to generate a plurality of matching scores; and
a register coupled to the counting circuit for storing the matching scores from the counting circuit,
wherein
when the sensing amplifier circuit senses the first string current corresponding to the first string resistance, the counting circuit generates a first matching score;
when the sensing amplifier circuit senses the second string current corresponding to the second string resistance, the counting circuit generates a second matching score;
when the sensing amplifier circuit senses the third string current corresponding to the third string resistance, the counting circuit generates a third matching score;
the first matching score is higher than the second matching score, the second matching score is higher than the third matching score.

7. The memory apparatus according to claim 1, further including:
a plurality of weighting circuit coupled to the plurality of memory strings for assigning different weights to the plurality of string currents generated from the plurality of memory strings;
when the storage data includes a MSB and a LSB, a string current corresponding to searching the MSB is assigned by a first weight, a string current corresponding to searching the LSB is assigned by a second weight smaller than the first weight.

8. The memory apparatus according to claim 6, wherein
a plurality of reference face images are stored in the plurality of CAM cells of the plurality of memory strings;
in face image recognition, a face image under search is decoded into a plurality of search voltages to perform approximate search on the reference face images;
respective matching scores of the reference face images are counted by the counting circuit and stored in the register;
based on the matching scores, a target reference face image, corresponding to a highest matching score of the matching scores, among the reference face images is determined to be the same or most similar to the face image under search.

9. A data search and comparing method for a memory apparatus, the method comprising:
storing a storage data in a plurality of CAM cells of a plurality of memory strings;
performing data searching on the plurality of memory strings by a search data, wherein, during performing data searching, a string voltage is applied to the plurality of memory strings and the search data is input for comparing with the storage data stored in the plurality of CAM cells of the plurality of memory strings;

sensing, by a sensing amplifier circuit, a plurality of string currents generated from the plurality of memory strings corresponding to a plurality of string resistances to generate a plurality of sensing results, wherein on each of the plurality of memory strings, the string voltage and a string resistance of the plurality of string resistances corresponding to a number of mismatched bit(s) between the search data and the storage data enables a string current of the plurality of string currents; and based on the sensing results, determining the plurality of sensing results including at least one of an all-matched degree, a partially matched degree or an all-mismatched degree determined based the number of mismatched bit(s) between the search data and the storage data.

10. The data search and comparing method for the memory apparatus according to claim 9, wherein, on each of the plurality of memory strings, when the search data is all-matched with the storage data, the string resistance is a first string resistance enabling the string current being a first string current which is sensed by the sensing amplifier circuit, and indicates the all-matched degree in the plurality of sensing results, which the number of mismatched bit(s) between the search data and the storage data is zero;

when the search data is partially-matched with the storage data, the string resistance is a second string resistance enabling the string current being a second string current which is sensed by the sensing amplifier circuit, and indicates the partially-matched degree in the plurality of sensing results, which the number of mismatched bit(s) between the search data and the storage data is in the range of one to zero; and when the search data is all-mismatched with the storage data, the string resistance is a third string resistance enabling the string current being a third string current which is sensed by the sensing amplifier circuit, and indicates the partially-matched degree in the plurality of sensing results, wherein the first string current is higher than the second string current, and the second string current is higher than the third string current, wherein the third memory resistance is higher than the second string resistance, and the second string resistance is higher than the first string resistance.

11. The data search and comparing method for the memory apparatus according to claim 9, wherein each of the plurality of CAM cells includes a first memory cell and a second memory cell coupled in series along a channel current path;

when a first predetermined storage data is stored in the CAM cell, a first threshold voltage of the first memory cell is a first reference threshold voltage and a second threshold voltage of the second memory cell is a second reference threshold voltage;

when a second predetermined storage data is stored in the CAM cell, the first threshold voltage of the first memory cell is the second reference threshold voltage and the second threshold voltage of the second memory cell is the first reference threshold voltage;

when a third predetermined storage data is stored in the CAM cell, the first threshold voltage of the first memory cell and the second threshold voltage of the second memory cell are both the first reference threshold voltage; and when a fourth predetermined storage data is stored in the CAM cell, the first threshold voltage of the first memory cell and the second threshold voltage of the second memory cell are both the second reference threshold voltage.

12. The data search and comparing method for the CAM memory device according to claim 11, wherein when the search data is a first predetermined search data, a first search voltage applied to the first memory cell is a first reference search voltage and a second search voltage applied to the second memory cell is a second reference search voltage;

when the search data is a second predetermined search data, the first search voltage applied to the first memory cell is the second reference search voltage and the second search voltage applied to the second memory cell is the first reference search voltage;

when the search data is a third predetermined search data, the first search voltage applied to the first memory cell and the second search voltage applied to the second memory cell are both the second reference search voltage; and when the search data is a fourth predetermined search data, the first search voltage applied to the first memory cell and the second search voltage applied to the second memory cell are both the first reference search voltage, wherein the first reference search voltage is lower than the second reference search voltage.

13. The data search and comparing method for the memory apparatus according to claim 9, wherein wherein the sensing amplifier circuit includes a sensing time configured to be set to output hamming distance (HD) results corresponding to the all-match state, the partial-match state or the all-mismatch state of the plurality of sensing results, wherein the sensing amplifier circuit includes a plurality of sensing amplifiers one-to-one coupled to the plurality of memory strings, wherein when the string current sensed by a sensing amplifier of the plurality of sensing amplifiers, corresponding to the string resistance of a memory string of the plurality of memory strings, is determined as the martial-match state or the all-match state and that the number of mismatched bit(s) lower than a HD threshold value, the sensing amplifier outputs a first logic digital signal; and when the string current sensed by the sensing amplifier, corresponding to the string resistance of a memory string of the plurality of memory strings, is determined as the martial-match state or the all-mismatched state and that the number of mismatched bit(s) higher than a HD threshold value, the sensing amplifier outputs a second logic digital signal, wherein a counting circuit coupled to the sensing amplifier circuit is configured to count a number of the first logic digital signal and a number of the second digital signal from the sensing amplifier circuit to generate a plurality of matching scores.

14. The data search and comparing method for the memory apparatus according to claim 10, further including:

counting the sensing results to generate a plurality of matching scores; and storing the matching scores, wherein when the sensing amplifier circuit senses the first memory string current corresponding to the first memory string resistance, the counting circuit generates a first matching score;

when the sensing amplifier circuit senses the second memory string current corresponding to the second memory string resistance, the counting circuit generates a second matching score;

when the sensing amplifier circuit senses the third memory string current corresponding to the third memory string resistance, the counting circuit generates a third matching score;

the first matching score is higher than the second matching score, the second matching score is higher than the third matching score.

15. The data search and comparing method for the memory apparatus according to claim 9, wherein when the storage data includes a MSB and a LSB, a memory string current corresponding to searching the MSB is assigned by a first weight, a memory string current corresponding to searching the LSB is assigned by a second weight smaller than the first weight.

16. The data search and comparing method for the CAM memory device according to claim 14, wherein a plurality of reference face images are stored in the plurality of memory strings;

a plurality of reference face images are stored in the plurality of CAM cells of the plurality of memory strings;

in face image recognition, a face image under search is decoded into a plurality of search voltages to perform approximate search on the reference face images;

respective matching scores of the reference face images are counted by the counting circuit and stored in the register;

based on the matching scores, a target reference face image, corresponding to a highest matching score of the matching scores, among the reference face images is determined to be the same or most similar to the face image under search.

17. A 3D memory apparatus, comprising:

a plurality of computing arrays, configured to store a plurality of databases, each of the plurality of computing arrays comprising a plurality of blocks, each of the plurality of blocks comprising a plurality of memory strings, each of the plurality of memory strings including a plurality of CAM cells;

a sensing amplifier circuit coupled to the plurality of memory blocks via a plurality of master bit lines;

a counting circuit coupled to the sensing amplifier circuit; and a register coupled to the counting circuit, wherein during a data searching operation, a string voltage is applied to the plurality of memory strings of a selected block of the plurality of blocks, and a search data is input for comparing with a storage data stored in the plurality of CAM cells of the plurality of memory strings of the selected block, wherein, on each of the plurality of memory strings of the selected block, the string voltage and the string resistance corresponding to a number of mismatched bit(s) between the search data and the storage data enables a string current, wherein the string current on each of the plurality of memory strings is sensed by the sensing amplifier circuit to generate a plurality of sensing results of the selected block, the plurality of sensing results including at least one of an all-matched degree, a partially-matched degree or an all-mismatched degree determined based the number of mismatched bit(s) between the search data and the storage data, wherein the counting circuit is configured to count the plurality of sensing results to generate a plurality of matching scores, and the register is configured to store the plurality of matching scores from the counting circuit.

18. The 3D memory apparatus according to claim 17, wherein, on each of the plurality of memory strings, when the search data is all-matched with the storage data, the string resistance is a first string resistance enabling the string current being a first string current which is sensed by the sensing amplifier circuit, and indicates the all-matched degree in the plurality of sensing results, which the number of mismatched bit(s) between the search data and the storage data is zero;

when the search data is partially-matched with the storage data, the string resistance is a second string resistance enabling the string current being a second string current which is sensed by the sensing amplifier circuit, and indicates the partially-matched degree in the plurality of sensing results, which the number of mismatched bit(s) between the search data and the storage data is in the range of one to zero; and when the search data is all-mismatched with the storage data, the string resistance is a third string resistance enabling the string current being a third string current which is sensed by the sensing amplifier circuit, and indicates the partially-matched degree in the plurality of sensing results, wherein the first string current is higher than the second string current, and the second string current is higher than the third string current, wherein the third memory resistance is higher than the second string resistance, and the second string resistance is higher than the first string resistance.

19. The 3D memory apparatus according to claim 17, wherein each of the plurality of CAM cells includes a first memory cell and a second memory cell coupled in series along a channel current path;

when a first predetermined storage data is stored in the CAM cell, a first threshold voltage of the first memory cell is a first reference threshold voltage and a second threshold voltage of the second memory cell is a second reference threshold voltage;

when a second predetermined storage data is stored in the CAM cell, the first threshold voltage of the first memory cell is the second reference threshold voltage and the second threshold voltage of the second memory cell is the first reference threshold voltage;

when a third predetermined storage data is stored in the CAM cell, the first threshold voltage of the first memory cell and the second threshold voltage of the second memory cell are both the first reference threshold voltage; and when a fourth predetermined storage data is stored in the CAM cell, the first threshold voltage of the first memory cell and the second threshold voltage of the second memory cell are both the second reference threshold voltage, wherein, when the search data is a first predetermined search data, a first search voltage applied to the first memory cell is a first reference search voltage and a second search voltage applied to the second memory cell is a second reference search voltage;

when the search data is a second predetermined search data, the first search voltage applied to the first memory cell is the second reference search voltage and the second search voltage applied to the second memory cell is the first reference search voltage;

when the search data is a third predetermined search data, the first search voltage applied to the first memory cell and the second search voltage applied to the second memory cell are both the second reference search voltage; and when the search data is a fourth predetermined search data, the first search voltage applied to the first memory cell and the second search voltage applied to the second memory cell are both the first reference search voltage, wherein the first reference search voltage is lower than the second reference search voltage.

20. The 3D memory apparatus according to claim 17, wherein the sensing amplifier circuit includes a sensing time configured to be set to output hamming distance (HD) results corresponding to the all-match state, the partial-match state or the all-mismatch state of the plurality of sensing results, wherein the sensing amplifier circuit includes a plurality of sensing amplifiers one-to-one coupled to the plurality of memory strings, wherein when the string current sensed by a sensing amplifier of the plurality of sensing amplifiers, corresponding to the string resistance of a memory string of the plurality of memory strings, is determined as the martial-match state or the all-match state and that the number of mismatched bit(s) lower than a HD threshold value, the sensing amplifier outputs a first logic digital signal; and when the string current sensed by the sensing amplifier, corresponding to the string resistance of a memory string of the plurality of memory strings, is determined as the martial-match state or the all-mismatched state and that the number of mismatched bit(s) higher than a HD threshold value, the sensing amplifier outputs a second logic digital signal, wherein the counting circuit coupled is configured to count a number of the first logic digital signal and a number of the second digital signal from the plurality of sensing results of the selected block to generate a matching score.

* * * * *